United States Patent
Lee et al.

(10) Patent No.: US 9,594,145 B2
(45) Date of Patent: Mar. 14, 2017

(54) METHOD AND APPARATUS FOR ACQUIRING B1 MAGNETIC FIELD INFORMATION

(71) Applicants: Samsung Electronics Co., Ltd., Gyeonggi-do (KR); Industry Academic Cooperation Foundation Kyunghee University, Gyeonggi-do (KR)

(72) Inventors: Ju-hyung Lee, Gyeonggi-do (KR); Soo-yeol Lee, Gyeonggi-do (KR)

(73) Assignees: Samsung Electronics Co., Ltd., Yeongtong-gu, Suwon-si, Gyeonggi-do (KR); Industry Academic Cooperation Foundation Kyunghee University, Giheung-gu, Yongin-si, Gyeonggi-do (KR)

(*) Notice: Subject to any disclaimer, the term of this patent is extended or adjusted under 35 U.S.C. 154(b) by 616 days.

(21) Appl. No.: 14/096,372

(22) Filed: Dec. 4, 2013

(65) Prior Publication Data

US 2014/0152308 A1    Jun. 5, 2014

Related U.S. Application Data

(60) Provisional application No. 61/733,121, filed on Dec. 4, 2012.

(30) Foreign Application Priority Data

Feb. 6, 2013    (KR) .................. 10-2013-0013496

(51) Int. Cl.
*G01V 3/00*      (2006.01)
*G01R 33/565*    (2006.01)
(Continued)

(52) U.S. Cl.
CPC ....... *G01R 33/5659* (2013.01); *G01R 33/246* (2013.01); *G01R 33/34092* (2013.01); *G01R 33/586* (2013.01)

(58) Field of Classification Search
USPC ..................................................... 324/309
See application file for complete search history.

(56) References Cited

U.S. PATENT DOCUMENTS 4,866,386 A    9/1989    Sattin
4,983,921 A    1/1991    Kramer et al.
(Continued)

FOREIGN PATENT DOCUMENTS

WO    2005/022184 A1    3/2005
WO    2011/155461 A1    12/2011

OTHER PUBLICATIONS

Yarnykh, "Actual Flip-Angle Imaging in the Pulsed Steady State: A Method for Rapid Three-Dimensional Mapping of the Transmitted Radiofrequency Field", Wiley-Liss, Inc., Sep. 22, 2006, pp. 192-200.

(Continued)

*Primary Examiner* — Rodney Fuller
(74) *Attorney, Agent, or Firm* — Cha & Reiter, LLC.

(57) ABSTRACT

A method acquires RF magnetic field information (B1 magnetic field information) in response to generated radio frequency (RF) pulses in a magnetic resonance imaging (MRI) system. An RF excitation pulse sequence is generated, and the generated RF excitation pulse sequence includes a plurality of RF excitation pulses individually having different flip angles. The generated RF excitation pulse sequence is transmitted to a target object. RF echo response signals are received from the target object corre- (Continued)

sponding to the plurality of RF excitation pulses and B1 information is acquired by processing the received RF echo response signals.

15 Claims, 4 Drawing Sheets

(51) Int. Cl.
    *G01R 33/34*     (2006.01)
    *G01R 33/24*     (2006.01)
    *G01R 33/58*     (2006.01)

(56) References Cited

U.S. PATENT DOCUMENTS

| | | |
|---|---|---|
| 8,077,955 B2 | 12/2011 | Dannels et al. |
| 2008/0150528 A1 | 6/2008 | Cunningham et al. |
| 2008/0197841 A1* | 8/2008 | Fleysher ............... G01R 33/54 324/307 |
| 2013/0082708 A1 | 4/2013 | Yokosawa et al. |
| 2014/0070805 A1* | 3/2014 | Van Der Meulen . G01R 33/246 324/309 |
| 2014/0218021 A1* | 8/2014 | Koehler ............... G01R 33/443 324/301 |
| 2015/0070013 A1* | 3/2015 | Schmidt ............... G01R 33/246 324/309 |

OTHER PUBLICATIONS

Sacolick et al., "B1 Mapping by Bloch-Siegert Shift", Wiley-Liss, Inc., Dec. 21, 2009, pp. 1315-1322.

Stollberger et al., "Imaging of the Active B1 Field in Vivo", Williams & Wilkins, Sep. 11, 1995, pp. 246-251.

Akoka, et al.; "Radiofrequency Map of an NMR Coil by Imaging"; Magnetic Resonance Imaging, 1993, pp. 437-441, vol. 11, Pergamon Press Ltd.

Counsell; "Stimulated Echoes and Spin Echoes. Simultaneous Determination of T2, Diffusion Coefficient, and RF Homogeneity"; Journal of Magnetic Resonance; 1993; pp. 28-34; Series B 101; Academic Press, Inc.

Jiru et al.; "Fast 3D Radiofrequency Field Mapping Using Echo-Planar Imaging"; Magnetic Resonance in Medicine; 2006; pp. 1375-1379; Wiley-Liss, Inc.

Kang et al.; "Fast B1 mapping based on interleaved-three-flip-angle (ITFA) excitation"; Oct. 10, 2013.

* cited by examiner

METHOD AND APPARATUS FOR ACQUIRING B1 MAGNETIC FIELD INFORMATION

CLAIM OF PRIORITY

This application claims the benefit of U.S. Provisional Application No. 61/733,121, field on Dec. 4, 2012, in the United States Patent and Trademark Office, and Korean Patent Application No. 10-2013-0013496, filed on Feb. 6, 2013, in the Korean Intellectual Property Office, the disclosures of which are incorporated herein in their entirety by reference.

BACKGROUND

1. Technical Field

A system concerns an RF magnetic field (B1 magnetic field) generated by radio frequency (RF) pulses and reducing errors due to spin lattice relaxation and accelerating acquisition of a B1 map.

2. Description of the Related Art

A known magnetic resonance imaging device provides non-invasiveness, superior contrast imaged tissues compared to a computer tomography (CT) device, and does not form artifacts due to bone tissues. Furthermore, a magnetic resonance imaging (MRI) system is capable of capturing various tomography images in desired directions without need to relocate a target object. A known MRI device generates a magnetic resonance (MR) image using differences between characteristics of tissues of a target object and reflects differences between magnetic resonance characteristics of tissues facilitating recognition of tissues in an MR image.

Uniformity of a magnetic field (B1) generated by radio frequency (RF) pulses in an MRI device affects uniformity of an MR image. Therefore, B1 shimming is employed to improve B1 uniformity by driving respective coil devices included in a transmission RF coil using driving signals having different magnitudes and phases. Further, an RF coil system employs multiple circuit structures and includes a plurality of coil devices. It is necessary to determine spatial B1 magnetic field distribution to perform the B1 shimming referred to as B1 mapping. There are different known B1 mapping methods for determining whether a magnetic field (B1 magnetic field) formed by RF pulses is homogeneous or inhomogeneous or for determining uniformity. B1 mapping is an auxiliary imaging operation for acquiring information necessary for compensating RF pulses.

The different known B1 mapping methods include a double angle method (DAM) that acquires a B1 map by acquiring two MR images by using RF pulses having different magnitudes and by calculating a ratio between magnitudes of signals of the two MR images. In this case, to minimize spin lattice relaxation time (T1) dependency of MR image signals, a long repetition time (TR), which is about five times longer than T1, is required. Therefore, the DAM requires a long period of time for B1 mapping. Furthermore, spatial distribution of B1 magnetic fields is changed when a target object of an MRI operation is changed. Therefore, it is necessary to perform B1 mapping for imaging for each new target object, and thus it is necessary to perform B1 mapping quickly.

However, in order to perform B1 mapping quickly, it is necessary to reduce the TR of a RF pulse sequence. However, when the TR is reduced, magnitudes of MR image signals are also affected by T1 and T1 varies according to type of human body tissues. Therefore, efficiency of B1 shimming using a B1 map is reduced if errors due to spin lattice relaxation are not compensated for during B1 mapping.

SUMMARY

A system reduces errors due to spin lattice relaxation and quickly acquires a B1 map. A method acquires RF magnetic field information (B1 magnetic field information) in response to generated radio frequency (RF) pulses in a magnetic resonance imaging (MRI) system. An RF excitation pulse sequence is generated. The RF excitation pulse sequence includes a plurality of RF excitation pulses individually having different flip angles. The RF excitation pulse sequence is transmitted to a target object. RF echo response signals are received from the target object corresponding to the plurality of RF excitation pulses and B1 information is acquired by processing the received RF echo response signals.

In a feature, the RF pulse sequence comprising a gradient echo sequence of at least three RF pulses of different magnitude, is generated, such that the plurality of RF pulses are interleaved at a predetermined time interval. A first RF pulse has a first flip angle $\alpha$, a second RF pulse has a second flip angle $\beta$, and a third RF pulse has a third flip angle $\gamma$, and the second flip angle $\beta$ and the third flip angle $\gamma$ are different real number multiples of the first flip angle $\alpha$. Further the method includes acquiring first ratio information determined using a magnitude of an echo response signal associated with the first RF pulse and a magnitude of an echo response signal associated with the second RF pulse; acquiring second ratio information determined using a magnitude of an echo response signal associated with the second RF pulse and a magnitude of an echo response signal associated with the third RF pulse; and acquiring a first flip angle $\alpha$ value of the first RF pulse by using the first ratio information and the second ratio information.

In another feature, the first ratio information is acquired according to Equations (1) and (3) below, the second ratio information is acquired according to Equations (2) and (3) below, $$R_1 = \frac{S_1}{S_2} = \frac{\sin\beta(1 + \cos\alpha \cdot E_1 + \cos\gamma \cdot \cos\alpha \cdot E_1^2)}{\sin\alpha(1 + \cos\gamma \cdot E_1 + \cos\beta \cdot \cos\gamma \cdot E_1^2)}, \quad (1)$$

$$R_2 = \frac{S_3}{S_2} = \frac{\sin\gamma(1 + \cos\beta \cdot E_1 + \cos\alpha \cdot \cos\beta \cdot E_1^2)}{\sin\beta(1 + \cos\alpha \cdot E_1 + \cos\gamma \cdot \cos\alpha \cdot E_1^2)}, \quad (2)$$

$$E_1 = e^{-\frac{T_1}{TR}}, \quad (3)$$

and in Equations (1) through (3) above, T1 denotes a spin lattice relaxation time, and TR denotes a predetermined time interval at which the first RF pulse, the second RF pulse, and the third RF pulse are interleaved. The acquired B1 information comprises a B1 map showing spatial distribution of B1 magnetic fields of the target object. A computer readable recording medium has recorded thereon a program for implementing the method.

In another feature, a B1 information acquisition apparatus acquires magnetic field information (B1 magnetic field information) generated by radio frequency (RF) pulses in an MRI system. The B1 information acquisition apparatus comprises a pulse sequence generating unit, an RF coil, and a control unit. The pulse sequence generating unit generates an RF excitation pulse sequence including a plurality of RF excitation pulses individually having different flip angles. The RF coil transmits the generated RF pulse sequence to a target object and receives echo response signals from the target object corresponding to the plurality of RF pulses. A control unit acquires B1 information by processing the received RF echo response signals.

BRIEF DESCRIPTION OF THE DRAWINGS

The above and other features and advantages of the system will become more apparent by describing in detail exemplary embodiments thereof with reference to the attached drawings in which.

DETAILED DESCRIPTION

Expressions such as "at least one of," when preceding a list of elements, modify the entire list of elements and do not modify the individual elements of the list.

In addition, although the terms used herein are selected from generally known and used terms, some of the terms mentioned in the description have been selected by the applicant at his or her discretion, the detailed meanings of which are described in relevant parts of the description herein. Moreover, each term such as " . . . unit" and "module" described in specification denotes an element for performing at least one function or operation, and may be implemented in hardware, software or a combination of hardware and software.

Hereinafter, the term "target object" may be any of different organs in a human body or in an animal or may be a particular location in a human body or in an animal. Furthermore, the target object may be a phantom, where the term 'phantom' refers to materials having volumes very similar to densities and effective atomic numbers of living organisms. For example, the phantom may be a spherical water phantom having properties similar to those of a human body.

Hereinafter, the term "user" refers to a medical expert and may include a doctor, a nurse, a medical technologist, a medical imaging expert, and a medical device repairman, but is not limited thereto.

Hereinafter, the term "pulse sequence" refers to a sequence of signals repeatedly applied in a magnetic resonance imaging (MRI) system. The pulse sequence may include time parameters of radio frequency (RF) pulses, e.g., repetition time (TR) and time-to-echo (TE).

Hereinafter, the term "pulse sequence diagram" refers to a sequence of events occurring in an MRI system. For example, the pulse sequence diagram may be a diagram showing at least one from among RF pulses, a gradient magnetic field, and an echo RF signal in a time order.

Figure 1:
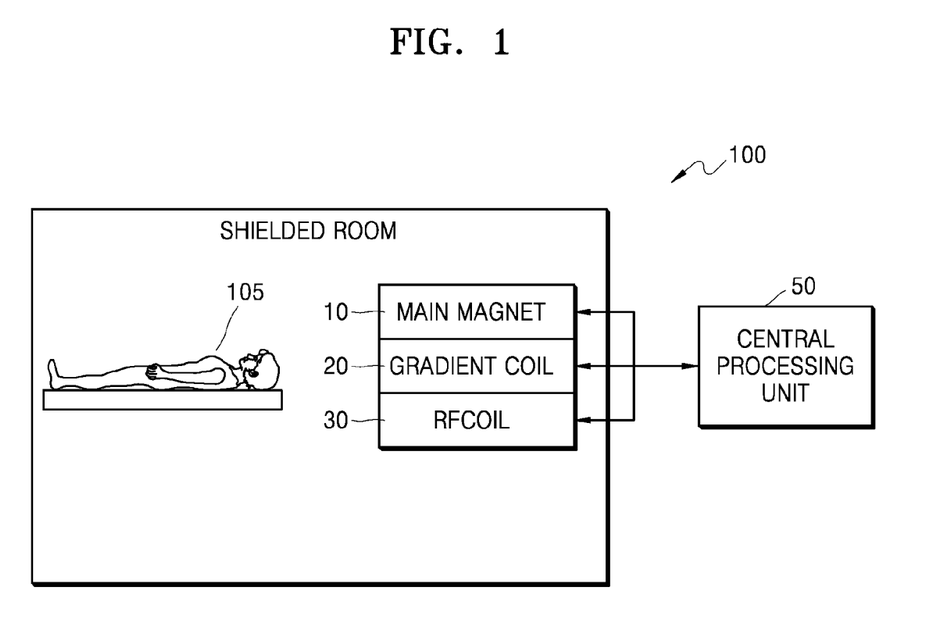
FIG. 1 shows a magnetic resonance imaging (MRI) system according to invention principles.

FIG. 1 is a diagram of MRI system 100. A target object 105 is imaged in a cylindrical gantry in a shielded room which blocks external RF signals. In the gantry, a main magnetic field B0 is formed by a main magnet 10. Magnetic field gradient pulses are transmitted by a gradient coil 20 and form a magnetic gradient field.

When the main magnetic field B0 is formed outside a target object, nuclei of atoms in the target object precess in the direction of the main magnetic field B0. Frequency of the precession, that is, resonance frequency is proportional to intensity of the main magnetic field B0, according to the Larmor equation. Here, the proportional constant thereof is referred to as a gyromagnetic ratio. When an electromagnetic wave having a same frequency as a resonance frequency is applied to a precessing atomic nucleus, the atomic nucleus resonates and a magnetization vector of the atomic nucleus is oriented perpendicular to the main magnetic field B0, where the rotated magnetization vector may become a signal source for an MR image. In other words, when RF magnetic field pulses having the same frequency as a resonant frequency are transmitted to an atomic nucleus resonating at the resonance frequency and transmission of the RF pulses is stopped thereafter, the atomic nucleus emits energy absorbed from the RF pulses, and the rotated magnetization vector induces voltage signals in a nearby RF coil. The voltage signals are commonly referred to as magnetic resonance signals.

An intensity of a magnetic resonance signal is proportional to magnitude of a magnetization vector, and the magnitude of the magnetization vector is proportional to an intensity of the main magnetic field B0. Therefore, the stronger the main magnetic field B0 becomes, the higher the signal-to-noise ratio (SNR) of an MR image becomes. The MRI system 100 may acquire an MR image by using RF signals emitted by the atomic nucleus. An RF coil may be used to apply electromagnetic waves to the target object 105 for resonating a magnetization vector in the target object 105 and to receive a magnetic resonance signal generated by a magnetization vector rotated on a transverse plane due to the resonance. A single RF coil may be used for both transmission and reception of RF signals. Alternatively, a transmission-only RF coil and a reception-only RF coil may be used for transmission and reception of RF signals, respectively. Transmission mode and reception mode may be performed by using the transmission-only RF coil and the reception-only RF coil, respectively.

Since a transmission coil is generally installed inside a gantry of the MRI system 100, the transmission coil may be arranged on a cylindrical frame having a sufficient magnitude for accommodating a human body therein. Meanwhile, a reception coil is generally used by being attached to the target object 105. Therefore, if the target object 105 is a human body, the reception coil is generally manufactured in correspondence to shapes of human body parts, e.g., a head coil, a neck coil, a waist coil, for example. An RF coil receives RF signals generated by a predetermined part of the target object 105 and forwards the RF signals to a central processing unit (CPU) 50 in an operation room separated from a shielded room, where the RF signals may be converted to an MR image via a signal processing process. Here, a weak magnetic field generated by RF pulses, e.g., a magnetic field having an intensity of around 25 μT, is referred to as a B1 magnetic field.

Three types of magnetic fields are required for forming an MR image. First, a main magnetic field for magnetizing atomic nuclei of magnetically resonating atoms in a human body, such as hydrogen, phosphor, and sodium, is required. Second, a spatially linear gradient magnetic field is required. Third, a RF magnetic field for rotating magnetization vectors of atomic nuclei magnetized for generating MR image signals on a transverse plane, that is, the B1 magnetic field, is required. The RF coil may be used to form the B1 magnetic field. An RF coil 30 used in the MRI system 100 may include a bird-cage RF coil forming a relatively highly uniform B1 magnetic field. However, in a high magnetic field (3 T or higher), uniformity of a B1 magnetic field may be degraded due to a target object of an MR image. Therefore, in a high magnetic field (3 T or higher) MRI system, B1 shimming may be used to improve the uniformity of a B1 magnetic field.

Magnitude of an MR image signal received after the MRI system 100 applies RF pulses to a target object via the RF coil is affected by different physical variables, e.g., a spin density, a spin lattice relaxation time T1, a spin lattice relaxation time T2, a flip angle, and reception sensitivity of a reception RF coil. Particularly, a ratio between MR image signals acquired by setting an echo time TE in a pulse sequence for acquiring an MR image may be affected by the spin lattice relaxation time T1 and the flip angle. A pulse sequence used for B1 mapping may include a spin echo (SE) pulse sequence and a gradient echo (GE) pulse sequence. The system herein is of particular use with a GE pulse sequence. Compared to the SE pulse sequence, the GE pulse sequence features a shorter repetition time TR and echo time TE and less heat accumulation in a human body due to an RF magnetic field. In an MR image, a flip angle $\Theta$ of an RF pulse associated with an individual pixel is proportional to a magnitude of a B1 magnetic field associated with the individual pixel. Therefore, spatial distribution of the B1 magnetic fields, that is, a B1 map may be acquired from spatial distribution of the flip angles $\Theta$.

Figure 2:
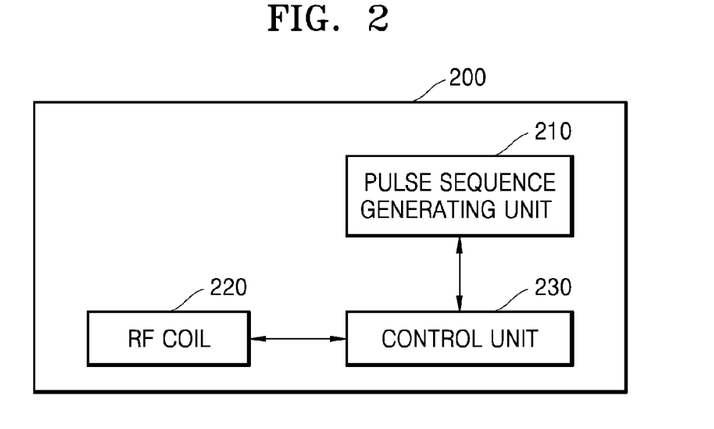
FIG. 2 shows a B1 information acquisition apparatus according to invention principles.

FIG. 2 shows a B1 information acquisition apparatus 200 that is either physically separated from, or integrated with, the MRI system 100 for providing an MR image. Apparatus 200 may include a pulse sequence generating unit 210, an RF coil 220, and a control unit 230. However, the B1 information acquisition apparatus 200 may include more components or less components. The pulse sequence generating unit 210 may generate an RF pulse sequence including a plurality of RF pulses having different flip angles. The pulse sequence generating unit 210 may generate an RF pulse sequence based on a user input or pulse sequence information stored in a memory (not shown). Here, the generated RF pulse sequence may include at least three RF pulses. The RF coil 220 may transmit an RF magnetic field pulse sequence generated in response to the pulse sequence generated by unit 210 to a target object and receive response signals corresponding to a plurality of RF pulses derived from the target object. Here, the RF coil 220 may be embodied as single phase or quadrature coils, surface coils, volume coils (Helmholtz or solenoid type) or phased-array coils, for example.

The control unit 230 may control the overall operation of the B1 information acquisition apparatus 200. For example, the control unit 230 may control the pulse sequence generating unit 210 and the RF coil 220 by executing programs stored in a memory (not shown). Furthermore, the control unit 230 may control the overall operation of the MRI system 100 and may acquire B1 information from response signals received by the RF coil 220. The control unit 230 may provide a B1 map indicating spatial distribution of a B1 magnetic field regarding a target object based on acquired B1 information. The B1 map may include an image indicating magnitudes of magnetic fields or phase distributions regarding a target object in color, highlighting or using shading or another visual attribute, based on acquired B1 information.

Figure 3:
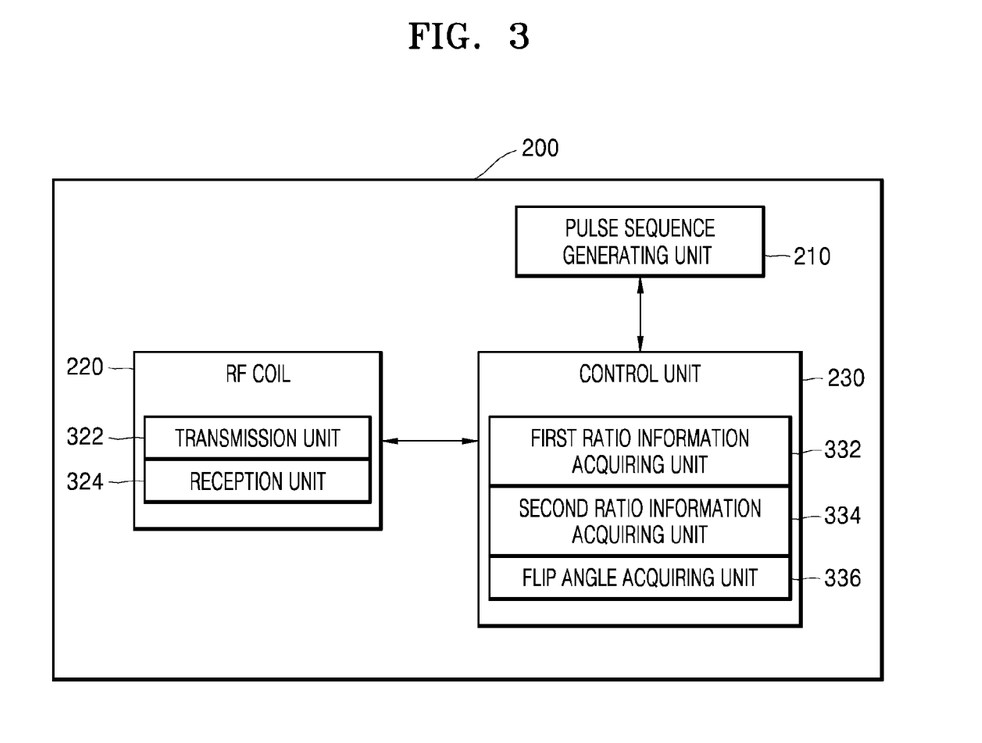
FIG. 3 shows a B1 information acquisition apparatus according to invention principles.

FIG. 3 shows B1 information acquisition apparatus 200 that may include a transmission unit 322 and a reception unit 324 in the RF coil 220. Furthermore, the B1 information acquisition apparatus 200 may include a first ratio information acquiring unit 332, a second ratio information acquiring unit 334, and a flip angle acquiring unit 336 in the control unit 230. The transmission unit 322 may transmit an RF pulse sequence generated by the pulse sequence generating unit 210 to a target object, whereas the reception unit 324 may receive response signals corresponding to the transmitted RF pulse sequence. The first ratio information acquiring unit 332 may acquire first ratio information regarding a ratio between a magnitude S1 of a response signal corresponding to a first RF pulse and a magnitude S2 of a response signal corresponding to a second RF pulse derived from at least three RF pulses included in the RF pulse sequence generated by the pulse sequence generating unit 210. The second ratio information acquiring unit 334 may acquire second ratio information regarding a ratio between the magnitude S2 of the response signal corresponding to the second RF pulse and a magnitude S3 of a response signal corresponding to a third RF pulse. The flip angle acquiring unit 336 may acquire a flip angle regarding the first RF pulse by using the first ratio information and the second ratio information. A method by which the B1 information acquisition apparatus 200 shown in FIG. 2 acquires B1 information using the above configuration will be described in detail with reference to FIG. 4.

Figure 4:
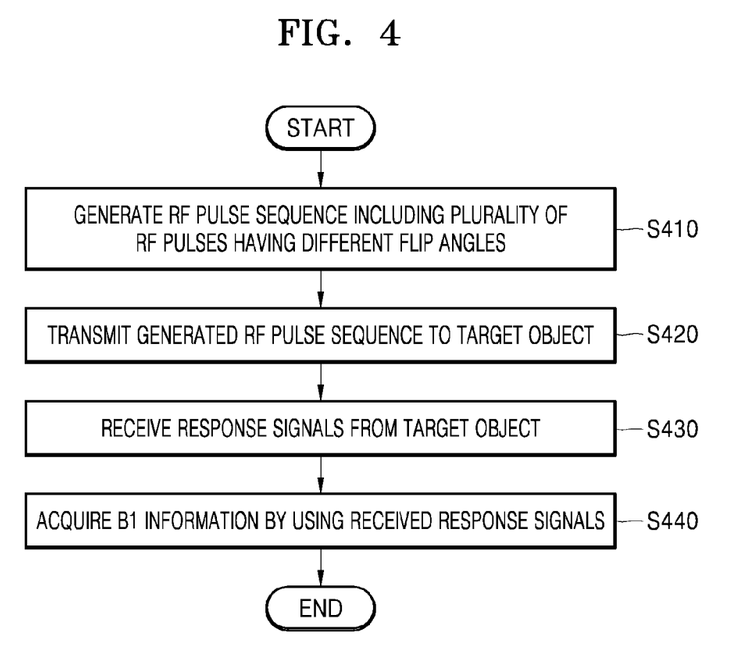
FIG. 4 is a flowchart of a method of acquiring B1 information according to invention principles.

FIG. 4 shows a flowchart of a method of acquiring B1 information. In an operation S410, the B1 information acquisition apparatus 200 may generate an RF pulse sequence including a plurality of RF pulses having different flip angles. Here, the generated RF pulse sequence may be an RF pulse sequence generated such that a plurality of RF pulses are interleaved using a constant time interval. For example, the RF pulse sequence may include at least three RF pulses. The operation S410 may be performed by the pulse sequence generating unit 210 of FIG. 2. In an operation S420, the B1 information acquisition apparatus 200 may transmit the RF pulse sequence generated in the operation S410 to a target object. The operation S420 may be performed by the RF coil 220 of FIG. 2 and the transmission unit 322 of FIG. 3.

In an operation S430, the B1 information acquisition apparatus 200 may receive response signals from the target object corresponding to the plurality of RF pulses to which the RF pulse sequence is applied. For example, the received response signals may include at least three different RF response signals respectively corresponding to the at least three different RF pulses included in the RF pulse sequence. The operation S430 may be performed by the RF coil 220 of FIG. 2 and the reception unit 324 of FIG. 3. In an operation S440, the B1 information acquisition apparatus 200 may acquire B1 information from the response signals received in the operation S430. The operation S440 may be performed by the control unit 230 of FIG. 2. The B1 information acquisition apparatus 200 may derive MR images based on the received response signals and may derive a B1 map from the acquired MR images. The operation S440 in which the B1 information acquisition apparatus 200 acquires B1 information by using the received response signals will be described in detail with reference to FIGS. 5 through 7.

Figure 5:
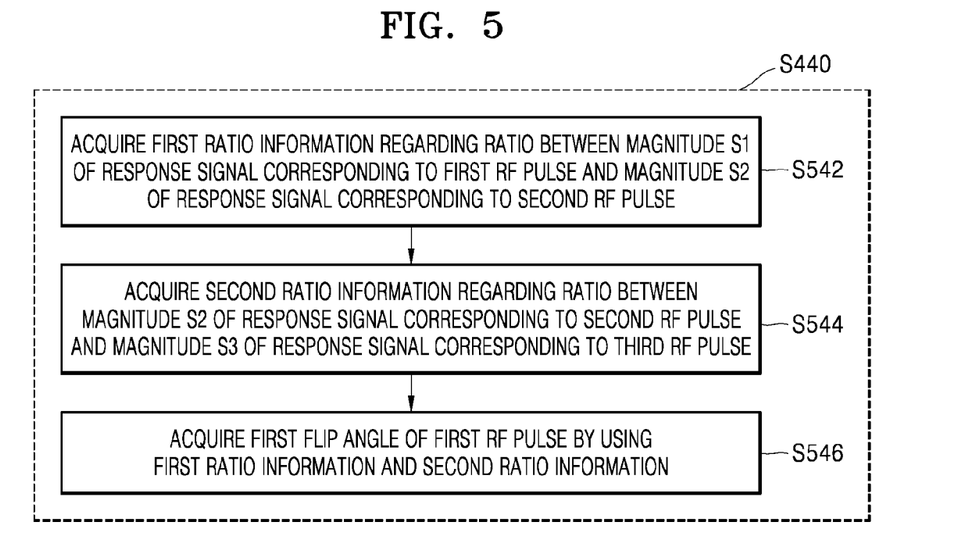
FIG. 5 is a flowchart of a method of acquisition of B1 information using received response signals according to invention principles.

FIG. 5 is a flowchart of a method of acquisition of B1 information using received response signals. The RF pulse sequence generated in the operation S410 may include at least a first RF pulse, a second RF pulse, and a third RF pulse. In an operation S542, the B1 information acquisition apparatus 200 may acquire a first ratio information between the magnitude S1 of a response signal corresponding to a first RF pulse and the magnitude S2 of a response signal corresponding to a second RF pulse. In an operation S544, the B1 information acquisition apparatus 200 may acquire a second ratio information between the magnitude S2 of the response signal corresponding to the second RF pulse and the magnitude S3 of a response signal corresponding to a third RF pulse. In an operation S546, the B1 information acquisition apparatus 200 may acquire a first flip angle of the first RF pulse by using the first ratio information and the second ratio information. If a second flip angle of the second RF pulse and a third flip angle of the third RF pulse are different real-number multiples of the first flip angle, the first flip angle may be acquired by mathematically calculating the first ratio information and the second ratio information.

Figure 6:
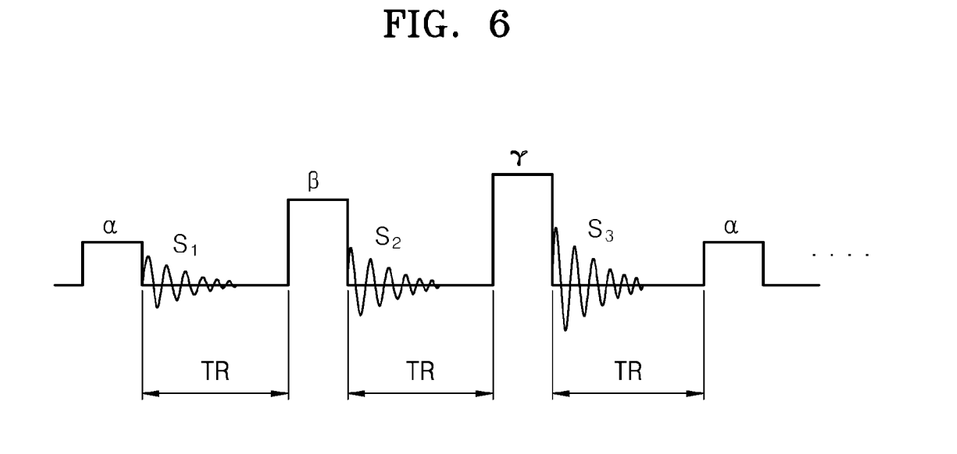
FIG. 6 shows a radio frequency (RF) pulse sequence transmitted to a target object, according to invention principles.

FIG. 6 shows an RF pulse sequence 600 transmitted to a target object for B1 mapping. The three RF pulses which have different magnitudes and are included in an RF pulse sequence transmitted to a target object may be periodically applied by being interleaved at a repetition time TR interval. The flip angle of the first RF pulse may be denoted as $\alpha$, the flip angle of the second RF pulse may be denoted as $\beta$, and the flip angle of the third RF pulse may be denoted as $\gamma$. Here, the flip angle refers to a flip angle at a location of a target object corresponding to a predetermined pixel in an MR image. A magnitude of a signal received from the location of the target object corresponding to the predetermined pixel in response to first RF pulse may be denoted as S1, a magnitude of a signal received from the location of the target object corresponding to the predetermined pixel in response the second RF pulse may be denoted as S2, and a magnitude of a signal received from the location of the target object corresponding to the predetermined pixel in response to the third RF pulse may be denoted as S3. In steady state magnetic resonance, relative ratios of S1, S2, and S3 may be expressed as shown in Equations 1 through 3 below.

$$R_1 = \frac{S_1}{S_2} = \frac{\sin\beta(1 + \cos\alpha \cdot E_1 + \cos\gamma \cdot \cos\alpha \cdot E_1^2)}{\sin\alpha(1 + \cos\gamma \cdot E_1 + \cos\beta \cdot \cos\gamma \cdot E_1^2)} \quad \text{[Equation 1]}$$

$$R_2 = \frac{S_3}{S_2} = \frac{\sin\gamma(1 + \cos\beta \cdot E_1 + \cos\alpha \cdot \cos\beta \cdot E_1^2)}{\sin\beta(1 + \cos\alpha \cdot E_1 + \cos\gamma \cdot \cos\alpha \cdot E_1^2)} \quad \text{[Equation 2]}$$

$$E_1 = e^{-\frac{T1}{TR}} \quad \text{[Equation 3]}$$

In Equations 1 through 3, T1 may denote a spin lattice relaxation time. Here, the term 'steady state' refers to a state in which RF pulses are being periodically applied and magnitudes of MR image signals are unchanged and constant after a sufficiently long period of time has elapsed. Generally, MR image signals may be in a steady state after RF pulses have been applied dozens of times.

In Equations 1 through 3, the ratio R1 between S1 and S2 and the ratio R2 between S2 and S3 are functions including the three flip angles $\alpha$, $\beta$, and $\gamma$ and T1. If the second flip angle $\beta$ and the third flip angle $\gamma$ satisfy Equation 4 below, R1 and R2 become functions including two variables $\alpha$ and T1.

$$\beta = c1 \cdot \alpha, \gamma = c2 \cdot \alpha \quad \text{[Equation 4]}$$

In Equation 4, c1 and c2 may be constants set in advance based on experiments.

To remove errors of MR image signals due to T1, $E_1$ may be approximated to 0 by using a relatively very long TR with respect to T1 or $E_1$ may be approximated to 1 by using a relatively very short TR with respect to T1.

For example, if B1 mapping is performed via a double angle method (DAM), a long TR, which is about 5 times longer than T1, is required to minimize T1 signal dependency. However, if a long TR is applied for B1 mapping, the overall imaging time increases, and there are limits for reducing TR, including due to a magnitude limit of a gradient magnetic field and a limit on pulse rise time. In Equations 1 through 3, R1 and R2 may be non-linear functions including $\alpha$ and T1. Therefore, regardless of length of TR, values of $\alpha$ and T1 at a predetermined pixel may be acquired by calculating non-linear simultaneous equations including two variables regarding R1 and R2. Therefore, since TR may be set to be from 5% to 20% of T1 not only when TR<T1, B1 mapping may be performed very fast, and thus the overall MR imaging time may be reduced.

Figure 7:
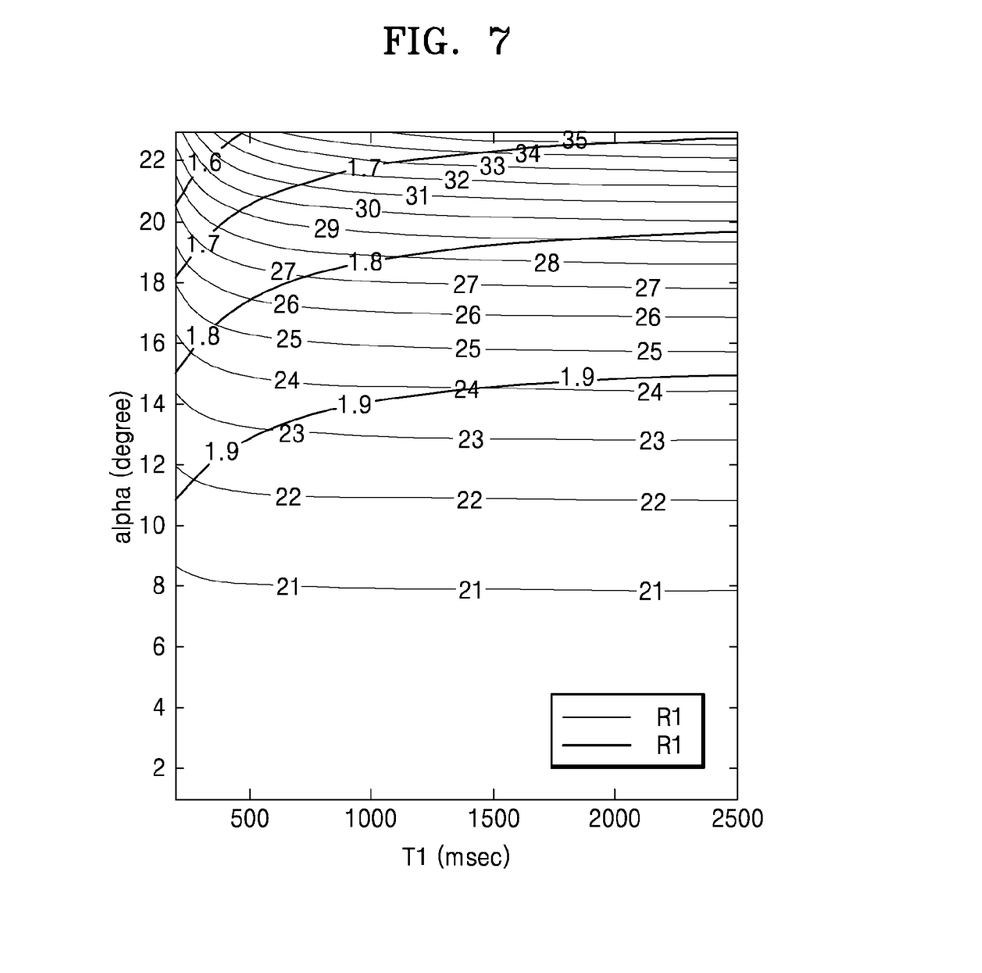
FIG. 7 shows a plot of characteristics of acquisition of B1 information according to invention principles.

FIG. 7 shows a plot of characteristics of acquisition of B1 information. For example, ratios R1 and R2 of magnitudes of response signals acquired by applying an RF pulse sequence including three RF pulses having flip angles $\alpha$, $\beta = 2 \cdot \alpha$, $\gamma = 4 \cdot \alpha$ to a target object are shown in the graphs of FIG. 7. The horizontal axis may indicate T1 values (ms), whereas the vertical axis may indicate $\alpha$ values (degrees). A point at which two curves represented by R1 and R2 are acquired may indicate a flip angle and a T1 value at a predetermined pixel location. Since R1 and R2 are in a non-linear relationship, values thereof, that is, $\alpha$ and T1, may be acquired via numerical analysis. To derive a B1 map, R1 and R2 are calculated with respect to the pixels and flip angles derived based on results of the calculations.

The system advantageously periodically applies a plurality of RF pulses having different magnitudes and that are interleaved in a single RF pulse sequence. For example, if three independent RF pulse sequences including 3 RF pulses each are sequentially applied, it is necessary for three periods to elapse until the RF pulse sequences are in a steady state. However, if three RF pulses, which are advantageously interleaved in a single RF pulse sequence are applied, it is necessary for one period to elapse. Therefore, the overall imaging time may be reduced. Furthermore, instead of sequentially applying three independent RF pulse sequences, three interleaved RF pulses are applied in a single RF pulse sequence, so response signals corresponding to the respective RF pulses are received at substantially the same time. Therefore, errors due to events occurring during an imaging operation, such as a movement of a target object, a drift of a shim offset current or of a gradient magnetic field, and a variation of output power of an amplifier, may be reduced, thereby reducing artifacts in a final image.

The system may be implemented as computer instructions which can be executed by different computer means, and recorded on a computer-readable medium. The computer-readable medium may include program commands, data files, data structures or a combination thereof. Examples of the computer-readable recording medium include magnetic media, such as a hard disk, a floppy disk, and a magnetic tape; optical media, such as a compact disk-read only memory (CD-ROM) and a digital versatile disc (DVD); magneto-optical media, such as optical disks; a read-only memory (ROM); a random access memory (RAM); and a flash memory. The medium may be a transmission medium, such as an optical or metal line, a waveguide, or carrier waves transferring program commands, data structures, and the like. Program commands may include, for example, a high-level language code that can be executed by a computer using an interpreter, as well as a machine language code made by a compiler.

While the system has been particularly shown and described with reference to exemplary embodiments thereof, it will be understood by those of ordinary skill in the art that different changes in form and details may be made therein without departing from the spirit and scope as defined by the following claims.

The above-described embodiments can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C. 112, sixth paragraph, unless the element is expressly recited using the phrase "means for."

DEFINITIONS

TI comprises inversion time, the time between an inversion recovery pulse and the next RF excitation pulse. TI determines the image contrast.

T1 comprises the longitudinal (or spin-lattice) relaxation time T1 decay constant.

T2 comprises the transverse (or spin-spin) relaxation time T2 is the decay constant for a proton spin component.

TR comprises repetition time, the time between successive RF excitation pulses.

Flip angle is an angle to which the net magnetization of a proton is rotated or tipped relative to the main magnetic field direction via the application of an RF excitation pulse at the Larmor frequency, i.e., an RF flip angle. For an inversion pulse, FA=180 degrees.

B0 is the main static base MRI magnetic field.

B1 is the RF transmit coil field.

What is claimed is:

1. A method of acquiring B1 magnetic field information in response to generated radio frequency (RF) pulses in a magnetic resonance imaging (MRI) system, the method comprising:
generating an RF excitation pulse sequence including interleaved first, second and third RF excitation pulses which are individually associated with different flip angles;
transmitting the generated RF excitation pulse sequence to a target object;
receiving RF echo response signals from the target object corresponding to the first, second and third RF excitation pulses; and
acquiring B1 information by processing the received RF echo response signals,
wherein, the first RF excitation pulse is associated with a first flip angle α, the second RF excitation pulse is associated with a second flip angle β, and the third RF excitation pulse is associated with a third flip angle γ, and the second flip angle β and the third flip angle γ are different integer multiples of the first flip angle α, and
where the acquiring of the B1 information comprises;
acquiring first ratio information determined using a magnitude of an echo response signal associated with the first RF excitation pulse and a magnitude of an echo response signal associated with the second RF excitation pulse;
acquiring second ratio information determined using a magnitude of an echo response signal associated with the second RF excitation pulse and a magnitude of an echo response signal associated with the third RF excitation pulse, and
acquiring a first flip angle α value of the first RF excitation pulse by using the first ratio information and the second ratio information.

2. The method of claim 1, wherein the first, second and third RF excitation pulses are interleaved at a predetermined time interval.

3. The method of claim 1, wherein the first, second and third RF excitation pulses are pulses of different respective magnitudes.

4. The method of claim 1, wherein the first ratio information is acquired according to Equations (1) and (3) below, the second ratio information is acquired according to Equations (2) and (3) below, $$R_1 = \frac{S_1}{S_2} = \frac{\sin\beta(1 + \cos\alpha \cdot E_1 + \cos\gamma \cdot \cos\alpha \cdot E_1^2)}{\sin\alpha(1 + \cos\gamma \cdot E_1 + \cos\beta \cdot \cos\gamma \cdot E_1^2)}, \quad (1)$$

$$R_2 = \frac{S_3}{S_2} = \frac{\sin\gamma(1 + \cos\beta \cdot E_1 + \cos\alpha \cdot \cos\beta \cdot E_1^2)}{\sin\beta(1 + \cos\alpha \cdot E_1 + \cos\gamma \cdot \cos\alpha \cdot E_1^2)}, \quad (2)$$

$$E_1 = e^{-\frac{T_1}{TR}}, \quad (3)$$

in Equations (1) through (3) above, T1 denotes a spin lattice relaxation time, and TR denotes a predetermined time interval at which the first RF excitation pulse, the second RF excitation pulse, and the third RF excitation pulse are interleaved.

5. The method of claim 1, wherein the acquired B1 information comprises a B1 map showing spatial distribution of B1 magnetic fields of the target object.

6. The method of claim 1, wherein the different flip angles are selected to enable TR, comprising repetition time between successive RF excitation pulses, to be less than 20% of T1 the longitudinal relaxation time decay constant facilitating accelerated acquisition of a B1 map.

7. The method of claim 1, wherein the RF excitation pulse sequence comprises a gradient echo sequence.

8. A computer readable recording medium having recorded thereon a program for implementing the method of claim 1.

9. A B1 information acquisition apparatus for acquiring B1 magnetic field information generated by radio frequency (RF) pulses in an MRI system, the B1 information acquisition apparatus comprising:
   a control unit configured for providing an RF excitation pulse sequence including interleaved first, second and third RF excitation pulses which are individually associated with different flip angles; and
   an RF coil for transmitting the generated RF excitation pulse sequence to a target object and receiving echo response signals from the target object corresponding to the first, second and third RF excitation pulses;
   wherein the control unit is further configured for acquiring B1 information by processing the received RF echo response signals,
   wherein, the first RF excitation pulse is associated with a first angle $\alpha$, the second RF excitation pulses is associated with a second flip angle $\beta$, and the third RF excitation pulse is associated with a third flip angle $\gamma$, and the second flip angle $\beta$ and the third flip angle $\gamma$ are different integer multiples of the first flip angle $\alpha$, and
   wherein the control unit acquires the B1 information by
      acquiring first ratio information using a magnitude of an echo response signal corresponding to the first RF excitation pulse and a magnitude of an echo response signal corresponding to the second RF excitation pulse;
      acquires second ratio information using a magnitude of an echo response signal corresponding to the second RF excitation pulse and a magnitude of an echo response signal corresponding to the third RF excitation pulse, and
      determines the first flip angle $\alpha$ of the first RF excitation pulse by using the first ratio information and the second ratio information.

10. The B1 information acquisition apparatus of claim 9, wherein the control unit provides the RF excitation pulse sequence, such that the first, second and third RF excitation pulses are interleaved at a predetermined time interval.

11. The B1 information acquisition apparatus of claim 10, wherein the control unit acquires the first ratio information according to Equations (1) and (3) below,
   the control unit acquires the second ratio information according to Equations (2) and (3) below, $$R_1 = \frac{S_1}{S_2} = \frac{\sin\beta(1 + \cos\alpha \cdot E_1 + \cos\gamma \cdot \cos\alpha \cdot E_1^2)}{\sin\alpha(1 + \cos\gamma \cdot E_1 + \cos\beta \cdot \cos\gamma \cdot E_1^2)}, \quad (1)$$

$$R_2 = \frac{S_3}{S_2} = \frac{\sin\gamma(1 + \cos\beta \cdot E_1 + \cos\alpha \cdot \cos\beta \cdot E_1^2)}{\sin\beta(1 + \cos\alpha \cdot E_1 + \cos\gamma \cdot \cos\alpha \cdot E_1^2)}, \quad (2)$$

$$E_1 = e^{-\frac{T_1}{TR}}, \quad (3)$$

and
   in Equations (1) through (3) above, T1 denotes a spin lattice relaxation time, and TR denotes a predetermined time interval at which the first RF excitation pulse, the second RF excitation pulse, and the third RF excitation pulse are interleaved.

12. The B1 information acquisition apparatus of claim 9, wherein the first, second and third RF excitation pulses are RF excitation pulses of different respective magnitudes.

13. The B1 information acquisition apparatus of claim 9, wherein the control unit acquires the B1 information comprising a B1 map showing spatial distribution of B1 magnetic fields of the target object.

14. The B1 information acquisition apparatus of claim 9, wherein the different flip angles are selected to enable TR, comprising repetition time between successive RF excitation pulses, to be less than 20% of T1 the longitudinal relaxation time decay constant facilitating accelerated acquisition of a B1 map.

15. The B1 information acquisition apparatus of claim 9, wherein the RF excitation pulse sequence comprises a gradient echo sequence.

* * * * *